(12) United States Patent
Hwang

(10) Patent No.: US 8,270,233 B2
(45) Date of Patent: Sep. 18, 2012

(54) SEMICONDUCTOR MEMORY DEVICE

(75) Inventor: Sun Young Hwang, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 13/313,828

(22) Filed: Dec. 7, 2011

(65) Prior Publication Data

US 2012/0075937 A1    Mar. 29, 2012

Related U.S. Application Data

(62) Division of application No. 12/317,964, filed on Dec. 30, 2008, now Pat. No. 8,111,560.

(30) Foreign Application Priority Data

Oct. 2, 2008    (KR) .................... 10-2008-0097384

(51) Int. Cl.
  *G11C 5/14*    (2006.01)

(52) U.S. Cl. .................... 365/189.09; 365/207

(58) Field of Classification Search ............. 365/189.09, 365/207
See application file for complete search history.

(56) References Cited

U.S. PATENT DOCUMENTS

| | | | |
|---|---|---|---|
| 4,908,794 A | | 3/1990 | Yamaguchi |
| 5,424,657 A | * | 6/1995 | Van Brunt et al. .............. 326/63 |
| 5,506,808 A | | 4/1996 | Yamada et al. |
| 7,435,578 B2 | | 10/2008 | Wikswo et al. |
| 7,443,748 B2 | | 10/2008 | Aoki |

FOREIGN PATENT DOCUMENTS

KR    10-2006-0005799 A    1/2006

* cited by examiner

*Primary Examiner* — Jason Lappas
(74) *Attorney, Agent, or Firm* — John P. White; Cooper & Dunham LLP

(57) ABSTRACT

A semiconductor memory device includes a first sense amplifier which senses data on a first line pair and generates a first output signal; and a test unit which senses the data on a first line pair and transfers a second output signal to a second line in response to a test mode signal.

4 Claims, 4 Drawing Sheets

SEMICONDUCTOR MEMORY DEVICE

CROSS REFERENCE TO RELATED APPLICATIONS

This application is a divisional of U.S. application Ser. No. 12/317,964 filed Dec. 30, 2008 now U.S. Pat. No. 8,111,560, claiming priority to Korean application number 10-2008-0097384, filed Oct. 2, 2008.

TECHNICAL FIELD

The present invention relates to a semiconductor memory device, and more particularly, to a semiconductor memory device for detecting, in advance, a cell which may cause a malfunction of a sense amplifier.

BACKGROUND

In recent, semiconductor memory devices continue to approach to high integration and high speed with development of technologies and are employed and used in various products including large home electric appliances and small mobile products.

These semiconductor memory device is made up of a plurality of memory cells in which data is recorded, and the data is read out as '1' or '0' depending on an amount of charge accumulated in the memory cell. Upon read operation, the data stored in the memory cell is transferred through a bit line, a local line and a global line in turn, and is then outputted to an outside through a data pad. In order to prevent the data from being lost during passing through the various transfer paths, a sense amplifier is provided between respective lines to maintain data level. This sense amplifier is provided on the bit line, the local line and the global line, respectively.

Among these, a sense amplifier that senses the data inputted through the local line and transfers it to the global line will be exemplary described herein. In general, the sense amplifier receives and senses the data through a first line pair including a first line and a first inverted line and outputs it to a second line. At this time, in order for the sensing operation of the sense amplifier, a potential difference in the first line pair must be more than a predetermined level (hereinafter, referred to as 'sensing level'). The sense amplifier performs the sensing operation properly when the potential difference in the first line pair is more than the sensing level. On the contrary, an error occurs in the sensing operation when the potential difference in the first line pair is smaller than the sensing level. In other words, the sense amplifier cannot properly sense the data transferred through the first line pair and may output the data to the second line with the level of the data being inverted when the potential difference between the first line pair is smaller than the sensing level of the sense amplifier.

SUMMARY

Meanwhile, the sensing operation of the sense amplifier is unstable when the potential difference in the first line pair is in the vicinity of the sensing level. In other words, the potential difference in the first line pair varies finely around the sensing level by internal and external factors, therefore, the sense amplifier may sense the data inputted through the first line pair and transfer the data normally to the second line, or may not able to transfer the data by generation of the error during the sensing operation. This is a main cause that lowers reliability of the semiconductor memory device. Herein, the reason that the potential difference in the first line pair cannot be formed to be more than the sensing level of the sense amplifier is a defect in the cell, e.g. a defect that the cell cannot store the sufficient amount of charge.

Therefore, since the sensing operation is unstable and the result of data transfer through the sense amplifier may be different every time when the inputted potential difference in the line pair is in the vicinity of the sensing level of the sense amplifier, embodiments of the present invention are directed to a semiconductor memory device capable of detecting, in advance, a cell that causes such malfunction of the sense amplifier and raising the reliability of the semiconductor memory device.

In one embodiment, a semiconductor memory device includes a first sense amplifier which senses data on a first line pair and generates a first output signal; and a test unit which senses the data on a first line pair and transfers a second output signal to a second line in response to a test mode signal.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF THE PREFERRED EMBODIMENTS

Hereinafter, an embodiment of the present invention will be described with reference to accompanying drawings. The embodiment is for illustrative purposes only, and the scope of the present invention is not limited thereto.

Figure 1:
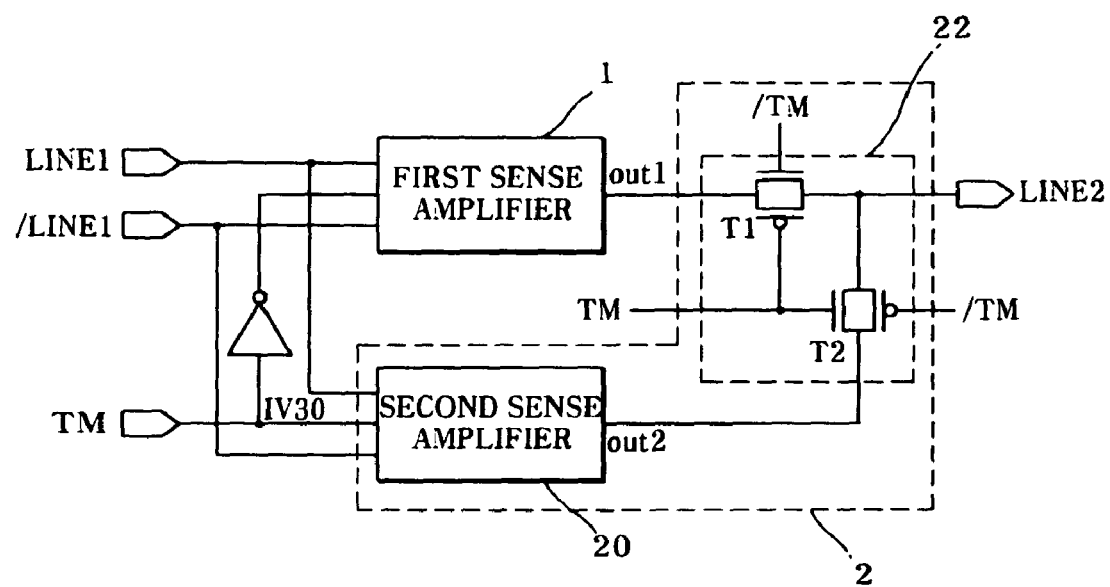
FIG. 1 is a structural diagram illustrating a semiconductor memory device according to a first embodiment of the present invention.

FIG. 1 is a structural diagram illustrating a semiconductor memory device according to a first embodiment of the present invention.

The semiconductor memory device according to the first embodiment of the present invention includes, as shown in FIG. 1, a first sense amplifier 1 that performs a sensing operation to generate a first output signal outs when a potential difference in a first line pair LINE1, /LINE1 is more than a first sensing level, and a test unit 2 that performs a sensing operation to transfer a second output signal out2 to a second line LINE2 when the potential difference in a first line pair LINE1, /LINE1 is more than a second sensing level. Herein, a test mode signal TM is a signal for indicating entrance into a test mode and is enabled to a high level upon the test mode and disabled to a low level upon a normal mode. Also, it is preferable that the first line pair LINE1, /LINE1 is a local line and the second line LINE2 is a global line.

Figure 2:
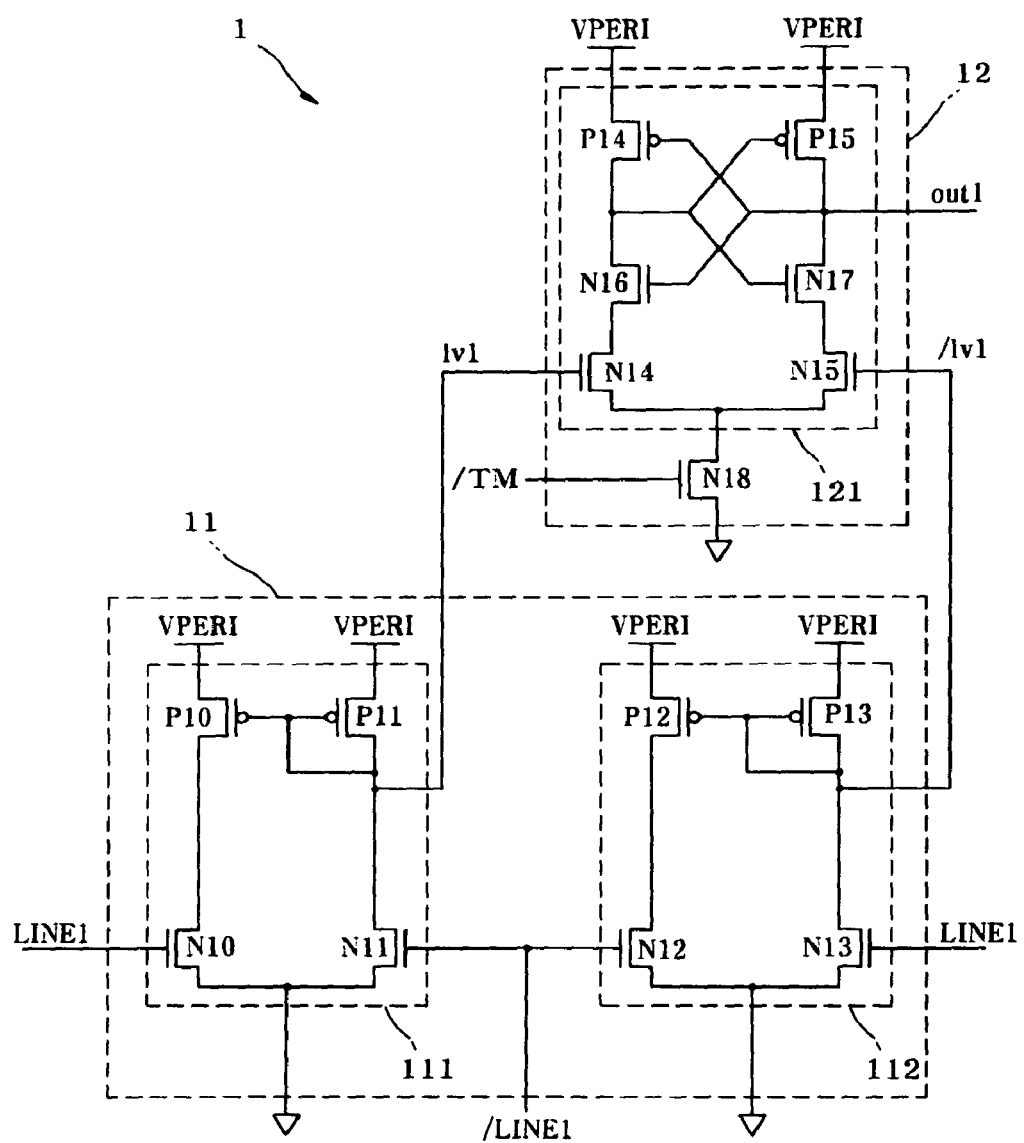
FIG. 2 is a diagram illustrating the first sense amplifier of FIG. 1.

The first sense amplifier 1 operates upon the normal mode and includes, as shown in FIG. 2, a first amplifying unit 11 and a second amplifying unit 12.

The first amplifying unit 11 includes a first level shift 111 that receives a signal of the first line pair LINE1, /LINE1 and level shifts its level to an internal voltage VPERI level to generate a level signal lv1 and a second level shifter 112 that receives a signal of the first line pair LINE1, /LINE1 and level shifts its level to the internal voltage VPERI level to generate an inverted level signal /lv1. Herein, the level signal lv1 and the inverted level signal /lv1 are inverted signals with respect to each other.

The second amplifying unit 12 includes a first latch 121 that receives and latches the level signal lv1 and the inverted level signal /lv1 to generate the first output signal out1 and a NMOS transistor N18 that controls the driving of the first latch 121 in response to the inverted signal of the test mode signal TM.

As described above, since the first amplifying unit 11 amplifies the data on the first line pair LINE1, /LINE1 with a large potential difference and the second amplifying unit 12 latches the output signal of the first amplifying unit 11, the first sense amplifier 1 has high sensing ability.

Meanwhile, the test unit 2 includes a second sense amplifier 20 and a transfer unit 22.

Figure 3:
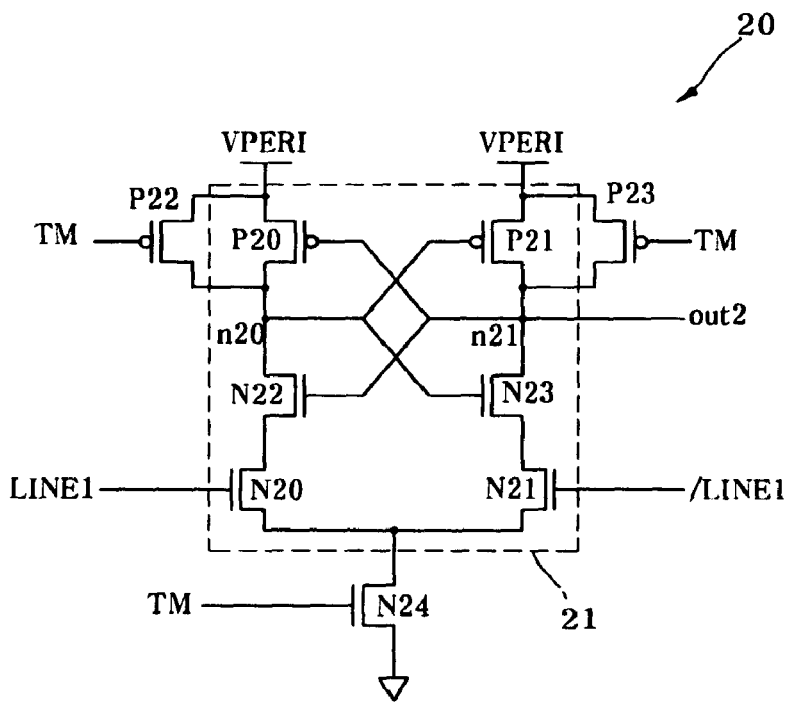
FIG. 3 is a diagram illustrating the second sense amplifier of FIG. 1.

The second sense amplifier 20 can be, as shown in FIG. 3, configured as a general cross coupled latch circuit, and includes a second latch 21 that receives and latches the data on the first line pair LINE1, /LINE1 to generate the second output signal out2, a NMOS transistor N24 that controls the driving of the second latch 21 in response to the test mode signal TM, and PMOS transistors P22, P23 that control the driving of the second latch 21 in response to the test mode signal TM. Herein, the PMOS transistors P22, P23 sets levels of nodes n20, n21 in response to the test mode signal TM to prevent a floated state.

The transfer unit 22 includes a first transfer device T1 that transfers the first output signal outs of the first sense amplifier 1 to the second line LINE2 in response to the test mode signal TM and a second transfer device T2 that transfers the second output signal out2 of the second sense amplifier 20 to the second line LINE2 in response to the test mode signal TM.

The first transfer device T1 is turned on when the test mode signal TM is disabled to a low level and the second transfer device T2 is turned on when the test mode signal TM is enabled to a high level. In other words, the first transfer device T1 and the second transfer device T2 are selectively turned on in response to the test mode signal TM. Therefore, the transfer unit 22 prevents that the first output signal out1 and the second output signal out2 are transferred to the second line LINE2 at the same time and thus collide with each other.

Meanwhile, as shown in FIG. 2, the first sense amplifier 1 constructed in two stages and has a sensing level smaller than the second sense amplifier 20. In other words, since the first sense amplifier 1 can sense smaller potential difference in the first line pair LINE1, /LINE1, the first sense amplifier 1 has higher sensing ability compared to the second sense amplifier 20. Of course, both the first sense amplifier 1 and the second sense amplifier 20 can be constructed in one stage, but in this case, sizes of the NMOS transistor and the PMOS transistors included in the first sense amplifier 1 should be enlarged to raise current properties of the first sense amplifier 1.

Driving of the test circuit according to the first embodiment of the present invention will be described separately with respect to the normal mode and the test mode.

First, in the normal mode, when the test mode signal TM is disabled to a low level, the first sense amplifier 1 becomes an enabled state and the second amplifier 20 becomes a disabled state. In other words, the first sense amplifier 1 becomes an enabled state as the NMOS transistor N18 is turned on in response to the test signal TM of low level while current path of the second sense amplifier 20 is cut off since the NMOS transistor N24 is turned off in response to the test signal TM of low level.

When the potential difference in the first line pair LINE1, /LINE1 is more than the first sensing level, the first sense amplifier 1 senses the data transferred through the first line pair LINE1, /LINE1 and transfers it to the second line LINE2. At this time, when the potential of the first line LINE1 is higher than the potential of the first inverted line /LINE1, the first sense amplifier 1 generates the level signal lv1 of high level and the inverted level signal /lv1 of low level through the first amplifying unit 11 and latches the level signal lv1 and the inverted level signal /lv1 through the second amplifying unit 12, thereby generating the first output signal outs of high level. Meanwhile, when the potential of the first line LINE1 is lower than the potential of the first inverted line /LINE1, the level signal lv1 of low level and the inverted level signal /lv1 of high level are generated through the first amplifying unit 11 and the generated level signal lv1 and inverted level signal /lv1 are latched through the second amplifying unit 12, thereby generating the first output signal outs of low level.

In the transfer unit 22, the first transfer device T1 is turned on and the second transfer device T2 is turned off in response to the test mode signal TM disabled to a low level. Therefore, only the first output signal out1 of the first sense amplifier 1 is transferred to the second line LINE2 through the first transfer device T1.

Next, in the test mode, when the test mode signal TM is enabled to a high level, the first sense amplifier 1 becomes a disabled state and the second amplifier 20 becomes an enabled state. In other words, current path of the first sense amplifier 1 is cut off as the NMOS transistor N18 is turned off in response to the test signal TM of high level, but the second sense amplifier 20 becomes an enabled state since the NMOS transistor N24 is turned on in response to the test signal TM of high level.

When the potential difference in the first line pair LINE1, /LINE1 is more than the second sensing level, the second sense amplifier 20 senses the data inputted through the first line pair LINE1, /LINE1 and transfers it to the second line LINE2. Meanwhile, when the potential difference in the first line pair LINE1, /LINE1 is smaller than the second sensing level, since the second sense amplifier 20 cannot sense the data properly, the second sense amplifier 20 cannot transfer the data normally to the second line LINE2.

Briefly describing, the second sense amplifier 20 that performs the sensing operation in the test mode is low sensing ability compared to the first sense amplifier 1 that performs the sensing operation in the normal mode. In other words, since the second sense amplifier 20 performs properly the sensing operation only when the potential difference in the first line pair LINE1, /LINE1 is more than the second sensing level, the second sense amplifier 20 cannot sense properly the data inputted through the first line pair LINE1, /LINE1 and thus the transfer of the data cannot performed normally when the potential difference in the first line pair LINE1, /LINE1 is in the vicinity of the first sensing level. At this time, it is possible to detect, in advance, the cell that may cause the malfunction of the first sense amplifier 1 by confirming the second output signal out2 outputted from the second sense amplifier 20.

Figure 4:
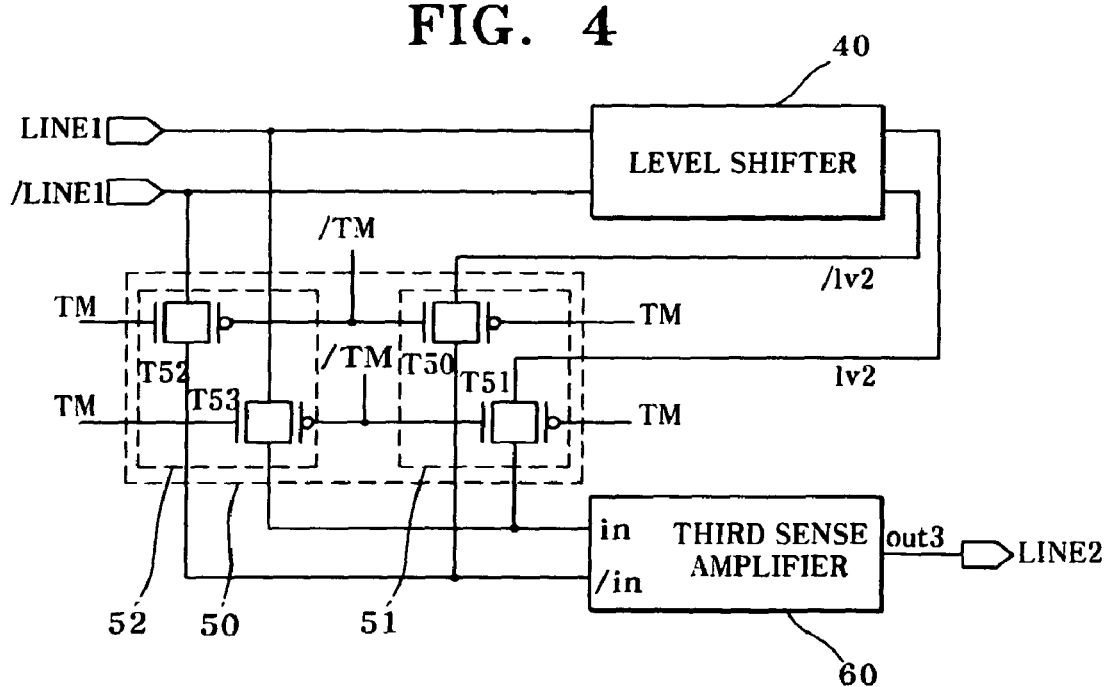
FIG. 4 is a structural diagram illustrating a semiconductor memory device according to a second embodiment of the present invention.

FIG. 4 is a structural diagram illustrating a semiconductor memory device according to a second embodiment of the present invention.

The semiconductor memory device according to the second embodiment of the present invention includes, as shown in FIG. 4, a level shifter 40 that level shifts a potential difference in a first line pair LINE1, /LINE1, a transfer unit 50 that selectively transfers a level signal lv2 and an inverted level signal /lv2 generated in the level shifter 40 or the signal of the first line pair LINE1, /LINE1 in response to a test mode signal TM and a third sense amplifier 60 that senses the output signal of the transfer unit 50 and generates a third output signal out3.

Figure 5:
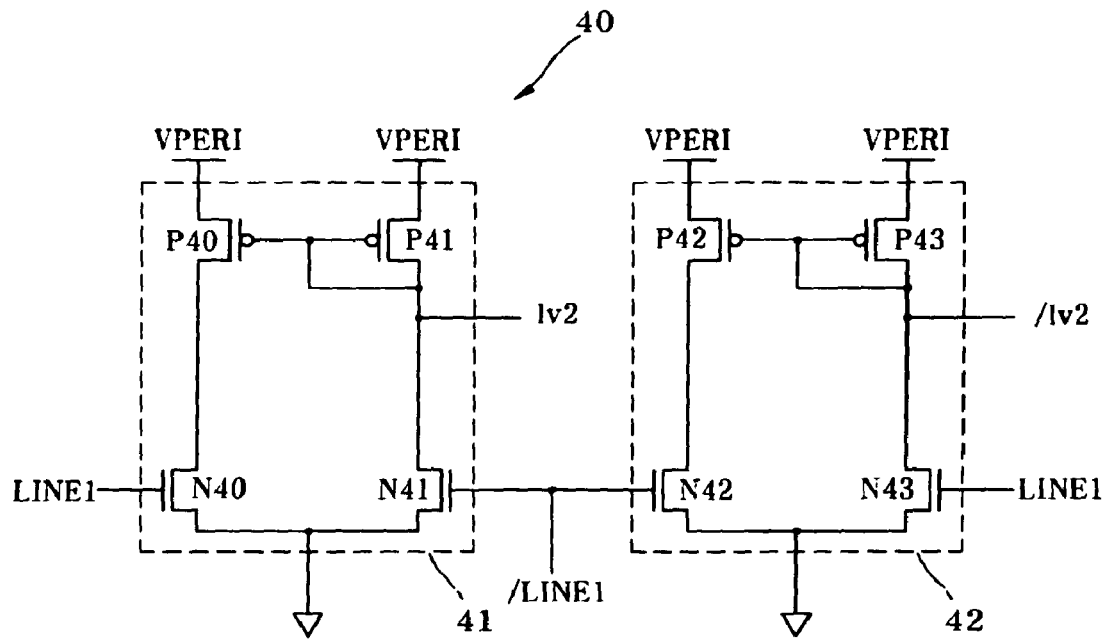
FIG. 5 is a diagram illustrating the level shifter of FIG. 4.

The level shifter 40 includes, as shown in FIG. 5, a first level shifter 41 that receives the signal of the first line pair LINE1, /LINE1 and level shifts its level to an internal voltage VPERI level to generate the level signal lv2 and a second level shifter 42 that receives the signal of the first line pair LINE1, /LINE1 and level shifts its level to an internal voltage VPERI level to generate the inverted level signal /lv2. The level shifter 40 receives the signal of the first line pair LINE1, /LINE1 and generates the level signal lv2 and the inverted level signal /lv2 having larger potential difference than that in the first line pair LINE1, /LINE1.

The transfer unit 50 includes a first transfer unit 51 that electrically connects the level shifter 40 with the third sense amplifier 60 in response to the test mode signal TM and a second transfer unit 52 that electrically connects the first line pair LINE1, /LINE1 with the third sense amplifier 60 in response to the test mode signal TM.

The first transfer unit 51 is turned on when the test mode signal TM is disabled to a low level. In other words, the first transfer unit 51 transfers the level signal lv2 and the inverted level signal /lv2 outputted from the level shifter 40 to the third sense amplifier 60 in a normal mode.

The second transfer unit 52 is turned on when the test mode signal TM is enabled to a high level. In other words, the second transfer unit 52 transfers the signal of the first line pair LINE, /LINE1 to the third sense amplifier 60 in a test mode.

Figure 6:
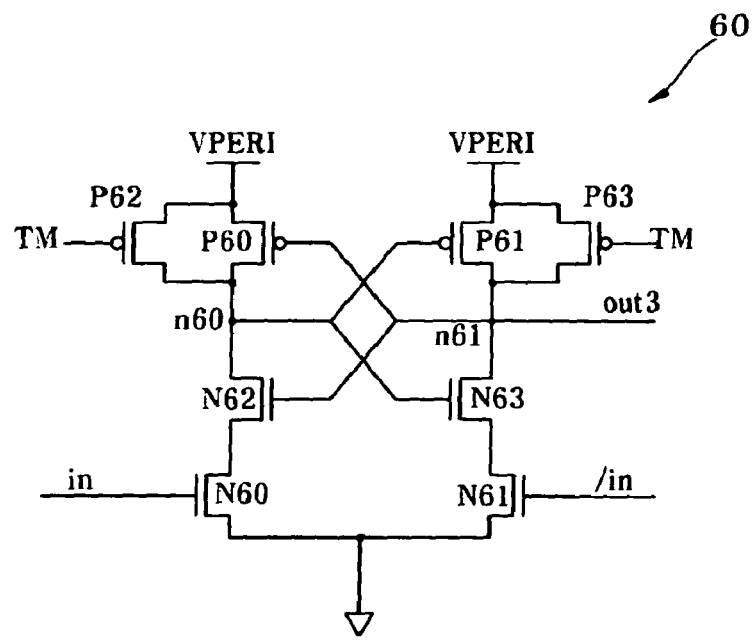
FIG. 6 is a diagram illustrating the third sense amplifier of FIG. 4.

The third sense amplifier 60 can be, as shown in FIG. 6, configured as a cross coupled latch circuit and latches input signals in, /in to generate the output signal out3.

In the present embodiment, the transfer unit 50 selectively couples the third sense amplifier 60 to the level shifter 40 or the first line pair LINE1, /LINE1 in response to the test mode signal TM. In other words, in the normal mode, the semiconductor memory device of the present embodiment has such a form that the level shifter 40 and the third sense amplifier 60 are coupled through the transfer unit 50. And, in the test mode, the semiconductor memory device of the present embodiment has such a form that the first line pair LINE1, /LINE1 and the third sense amplifier 60 are coupled through the transfer unit 50. Therefore, since the semiconductor memory device senses the signal formed by receiving and level shifting the signal of the first line pair LINE1, /LINE1 in the normal mode, the semiconductor memory device has superior sensing ability in the normal mode compared to the test mode in which the semiconductor memory device directly senses the signal of the first line pair LINE1, /LINE1.

In the present embodiment, the third sense amplifier 60 is commonly employed in the normal mode and the test mode. Therefore, the semiconductor memory device of the second embodiment has simpler structure than the semiconductor memory device of the first embodiment that is provided with the first sense amplifier 1 operating in the normal mode and the second sense amplifier 20 operating in the test mode separately.

Driving of the semiconductor memory device according to the second embodiment of the present invention will be described separately with respect to the normal mode and the test mode.

First, in the normal mode, when the first transfer unit 51 is turned on in response to the test mode signal TM of low level, the level shifter 40 is connected with the third sense amplifier 60 through the first transfer unit 51. In other words, in the normal mode, like the first sense amplifier 1 of the first embodiment shown in FIG. 1, the test circuit of the present embodiment senses the signal of the first line pair LINE1, /LINE1 and transfers it to the second line LINE2 when the potential difference in the first line pair LINE1, /LINE1 is larger than the first sensing level. More specifically, the level shifter 40 receives and level shifts the signal of the first line pair LINE1, /LINE1 to generate the level signal lv2 and the inverted level signal /lv2. At this time, when the potential of the first line LINE1 is higher than the potential of the first inverted line /LINE1, the level shifter 40 generates the level signal lv2 of high level and the inverted level signal /lv2 of low level. On the contrary, when the potential of the first line LINE1 is lower than the potential of the first inverted line /LINE1, the level shifter 40 generates the level signal lv2 of low level and the inverted level signal /lv2 of high level.

The third sense amplifier 60 latches the level signal lv2 and the inverted level signal /lv2 of the level shifter 40 to output the third output signal out3 to the second line LINE2.

Next, in the test mode, when the second transfer unit 52 is turned in response to the test mode signal of high level, the third sense amplifier 60 is connected with the first line pair LINE1, /LINE1. In other words, in the test mode, like the second sense amplifier 20 of the first embodiment, the test circuit of the present embodiment senses the signal of the first line pair LINE1, /LINE1 and transfers it to the second line LINE2 when the potential difference in the first line pair LINE1, /LINE1 is larger than the second sensing level.

As such, since the semiconductor memory device senses the signal of the first line pair LINE1, /LINE1 after level shifting the signal in the normal mode, the semiconductor memory device has superior sensing ability in the normal mode compared to the test mode in which the semiconductor memory device directly senses the signal of the first line pair LINE1, /LINE1.

Briefly describing, the semiconductor memory device has low sensing ability in the test mode compared to in the normal mode. In other words, since in the test mode, the semiconductor memory device performs properly the sensing operation only when the potential difference in the first line pair LINE1, /LINE1 is more than the second sensing level, the semiconductor memory device cannot sense properly the data transferred through the first line pair LINE1, /LINE1 and thus the transfer of the data cannot performed normally when the potential difference in the first line pair LINE1, /LINE1 is in the vicinity of the first sensing level. At this time, it is possible to detect, in advance, the cell that may cause the malfunction of the third sense amplifier 60 by confirming the third output signal out3 outputted to the second line LINE2.

While the present invention has been described with respect to the particular embodiments, it will be apparent to those skilled in the art that various changes and modifications may be made without departing from the spirit and scope of the invention as defined in the following claims.

The present application claims priority to Korean application number 10-2008-0097384, filed on Oct. 2, 2008, which is incorporated by reference in its entirety.

What is claimed is:

1. A semiconductor memory device, comprising:
a level shifter which level shifts signals of a line pair, and generates a level signal and an inverted level signal having a larger potential difference than a potential difference between the signals of the line pair;
a transfer unit which selectively transfers the level signal and the inverted level signal or the signals of the line pair, in response to a test mode signal; and
a sense amplifier which senses output signals of the transfer unit in response to the test mode signal.

2. The semiconductor memory device of claim 1, wherein the sensing operation is performed at a level more than a first sensing level when the output signals of the transfer unit are the level signal and the inverted level signal, and the sensing operation is performed at a level more than a second sensing level when the output signals of the transfer unit are the signals of the line pair.

3. The semiconductor memory device of claim 2, wherein the second sensing level is set so as to be larger than the first sensing level.

4. The semiconductor memory device of claim 1, wherein the transfer unit includes:
a first transfer unit which transfers the level signal and the inverted level signal to the sense amplifier in response to the test mode signal; and
a second transfer unit which transfers the signals of the line pair to the sense amplifier in response to the test mode signal.

* * * * *